(12) United States Patent
Srivastava et al.

(10) Patent No.: US 11,422,185 B2
(45) Date of Patent: Aug. 23, 2022

(54) SYSTEM AND METHOD FOR TESTING CRITICAL COMPONENTS ON SYSTEM-ON-CHIP

(71) Applicant: NXP USA, Inc., Austin, TX (US)

(72) Inventors: Neha Srivastava, New Delhi (IN); Garima Sharda, Beecave, TX (US)

(73) Assignee: NXP USA, Inc., Austin, TX (US)

( * ) Notice: Subject to any disclaimer, the term of this patent is extended or adjusted under 35 U.S.C. 154(b) by 253 days.

(21) Appl. No.: 16/917,663

(22) Filed: Jun. 30, 2020

(65) Prior Publication Data

US 2021/0405114 A1  Dec. 30, 2021

(51) Int. Cl.
*G01R 31/317* (2006.01)
*G01R 31/3177* (2006.01)

(52) U.S. Cl.
CPC ... *G01R 31/31724* (2013.01); *G01R 31/3177* (2013.01); *G01R 31/31712* (2013.01)

(58) Field of Classification Search
None
See application file for complete search history.

(56) References Cited

U.S. PATENT DOCUMENTS

| | | | |
|---|---|---|---|
| 6,247,144 B1 | 6/2001 | Macias-Garza et al. | |
| 7,020,803 B2 | 3/2006 | Wolin et al. | |
| 7,085,225 B2 | 8/2006 | Schaller et al. | |
| 7,941,722 B2 | 5/2011 | Cussonneau et al. | |
| 8,049,529 B2 | 11/2011 | Fulcomer | |
| 8,868,989 B2 | 10/2014 | Jindal et al. | |
| 8,954,806 B2 | 2/2015 | Dan et al. | |
| 9,336,074 B2 | 5/2016 | Chebruch et al. | |
| 10,078,565 B1 | 9/2018 | Petersson | |
| 10,643,011 B1 | 5/2020 | Nardi et al. | |
| 10,909,284 B1 | 2/2021 | Courch | |
| 2004/0017219 A1 | 1/2004 | Han | |
| 2005/0050387 A1 | 3/2005 | Mariani et al. | |
| 2007/0204190 A1 | 8/2007 | Hesse et al. | |
| 2007/0208977 A1 | 9/2007 | Clark et al. | |
| 2011/0231719 A1 | 9/2011 | Kim et al. | |
| 2012/0030532 A1 | 2/2012 | Jain et al. | |

(Continued)

FOREIGN PATENT DOCUMENTS

EP  2146212 A1  1/2010

OTHER PUBLICATIONS

U.S. Appl. No. 17/024,814, filed Sep. 18, 2020, 43 pages.

(Continued)

*Primary Examiner* — Guerrier Merant

(57) ABSTRACT

A system-on-chip (SoC) includes multiple critical components and a testing system to test the critical components. The critical components include an intellectual property (IP) core and an associated logic circuit. The testing system includes a controller, a fault injector, and a masking circuit. The controller is configured to receive a test initiation request and generate first and second select instructions. The fault injector is configured to generate and inject a set of fault inputs in the logic circuit based on the first select instruction to test the associated logic circuit and the IP core. The IP core is configured to generate a set of responses that is associated with the testing of the logic circuit and the associated IP core. The masking circuit is configured to mask and output the set of responses when the second select instruction indicates a first value and a second value, respectively.

20 Claims, 7 Drawing Sheets

(56) References Cited

U.S. PATENT DOCUMENTS

| | | |
|---|---|---|
| 2013/0145213 A1 | 6/2013 | Tang et al. |
| 2014/0365838 A1 | 12/2014 | Tekumalla et al. |
| 2019/0171536 A1 | 6/2019 | Refaeli et al. |
| 2019/0278677 A1 | 9/2019 | Terechko et al. |
| 2020/0117554 A1 | 4/2020 | Chaudhari et al. |

OTHER PUBLICATIONS

U.S. Appl. No. 17/024,798, filed Sep. 18, 2020, 36 pages.
U.S. Appl. No. 17/175,950, filed Feb. 15, 2021, 37 pages.
Mal-Sarkar et al., "Design and Validation for FPGA Trust under Hardware Trojan Attacks," IEEE Transactions on Multi-Scale Computing Systems. vol. 2. No. 3, Jul.-Sep. 2016, 13 pages.
Notice of Allowance for U.S. Appl. No. 17/175,950 dated Sep. 16, 2021.

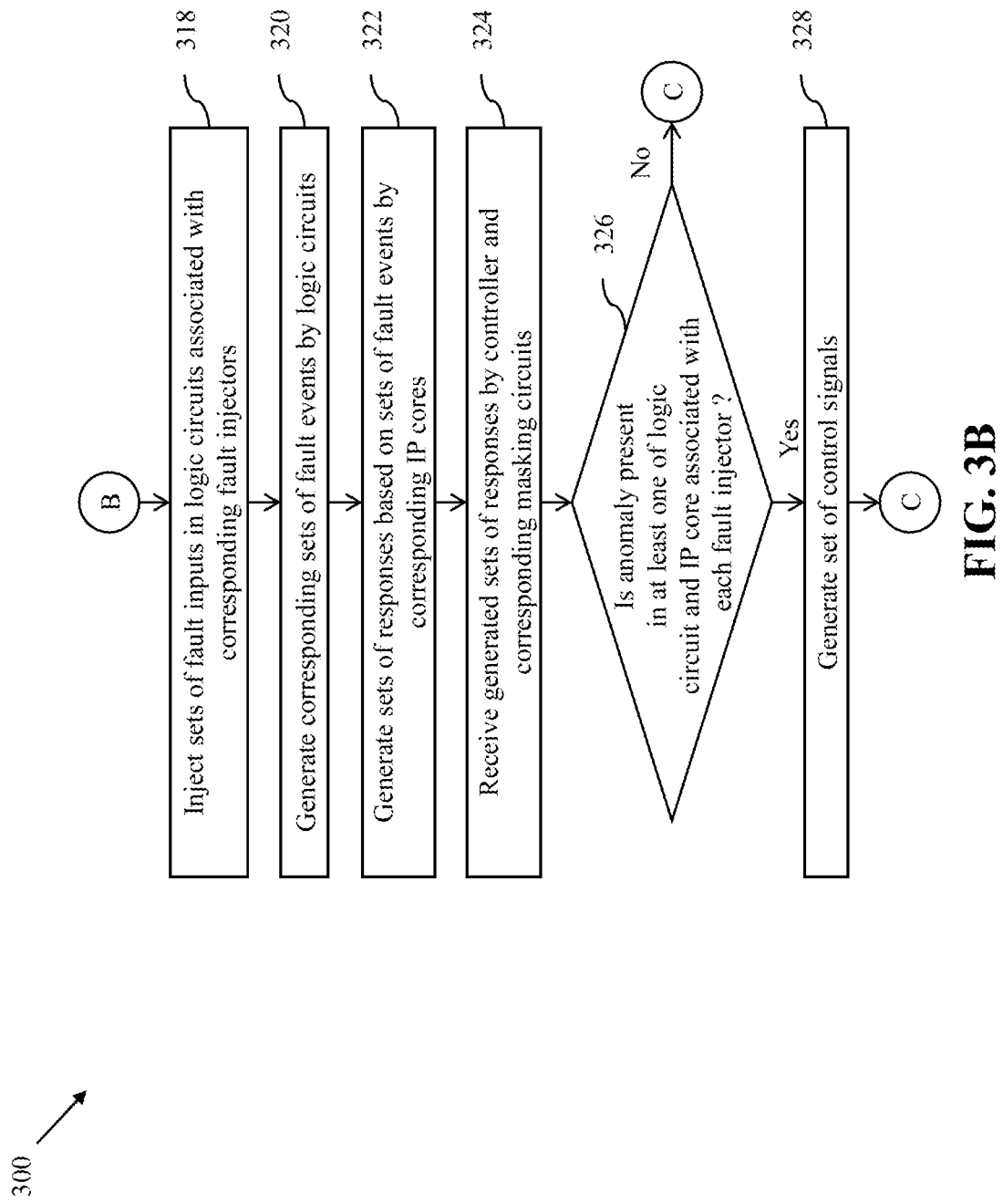

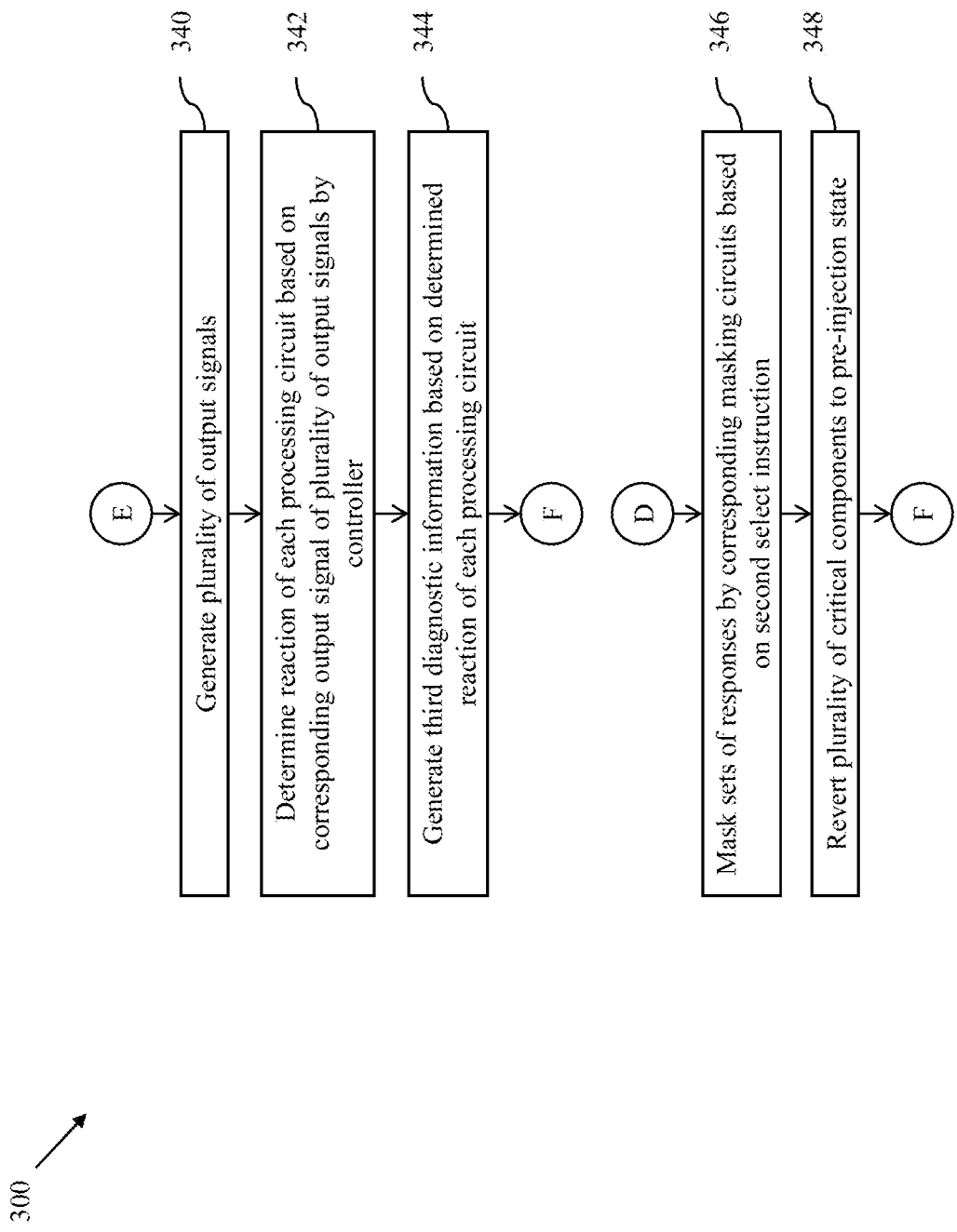

SYSTEM AND METHOD FOR TESTING CRITICAL COMPONENTS ON SYSTEM-ON-CHIP

BACKGROUND

The present disclosure relates generally to system-on-chips, and, more particularly, to a system and a method for testing critical components on a system-on-chip.

A system-on-chip (SoC) includes multiple critical components that perform critical functions on the SoC. To test a single critical component, such as an intellectual property (IP) core, a fault, i.e., a faulty input signal, is injected in the IP core and a response of the IP core is monitored to determine whether the IP core correctly detects the fault. However, the aforementioned technique is unable to monitor a propagation of fault through various circuits such as logic and processing circuits that are associated with the IP core, and hence fails to provide an end-to-end test coverage of all the critical components that are to be tested. The aforementioned technique thus cannot be utilized to test multiple IP cores and the critical circuitry associated with the cores.

A testing system, such as a logic built-in self-test (LBIST) system, may be utilized to test the critical components. Testing the critical components by the LBIST system requires the SoC to be reset each time after the completion of the testing of the critical components, and as the critical components need to be active to test other components on the SoC, a speed of operation of the SoC is affected. In addition, implementing the LBIST system to test the critical components, requires a large area on the SoC. Thus, there is a need for a testing system that solves the aforementioned problems of testing critical components.

SUMMARY

In one embodiment, a system-on-chip (SoC) is disclosed. The SoC includes a plurality of critical components and a testing system. The plurality of critical components comprise a logic circuit and an intellectual property (IP) core. The logic circuit is injected with a set of fault inputs, and is configured to generate a set of fault events. The IP core is coupled with the logic circuit, and is configured to receive the set of fault events and generate a set of responses. The testing system is coupled with the plurality of critical components and includes a controller, a fault injector, and a masking circuit. The controller is configured to receive a test initiation request and generate first and second select instructions. The fault injector is coupled with the controller, and is configured to receive a set of input signals and the first select instruction. The fault injector is further configured to generate and inject the set of fault inputs in the logic circuit to test the logic circuit and the IP core. The set of responses is associated with the testing of the logic circuit and the IP core. The masking circuit is coupled with the controller and the IP core and is configured to receive the set of responses and the second select instruction. The masking circuit is further configured to mask the set of responses when the second select instruction indicates a first value, and output the set of responses when the second select instruction indicates a second value.

In another embodiment, a method for testing a plurality of critical components of a system-on-chip (SoC) is disclosed. The method includes receiving, by a controller of the SoC, a test initiation request, and generating, by the controller, first and second select instructions based on the test initiation request. The method further includes receiving, by a fault injector of the SoC, a set of input signals and the first select instruction, and generating, by the fault injector, a set of fault inputs. The method further includes injecting, by the fault injector, the set of fault inputs in a logic circuit of the plurality of critical components to test the logic circuit and an intellectual property (IP) core of the plurality of critical components. The method further includes generating, by the logic circuit, a set of fault events, and generating, by the IP core, a set of responses based on the set of fault events. The set of responses is associated with the testing of the logic circuit and the IP core. The method further includes masking, by a masking circuit of the SoC, the set of responses when the second select instruction indicates a first value, and outputting, by the masking circuit, the set of responses when the second select instruction indicates a second value.

In some examples, the controller is further configured to receive the set of responses, and determine whether an anomaly is present or absent in at least one of the logic circuit and the IP core based on the set of responses. The controller is further configured to generate a set of control signals based on the determination of the presence or absence of the anomaly. When the anomaly is present, a first control signal of the set of control signals is a power-on reset signal, and indicates to reset the SoC. The controller is further configured to generate first diagnostic information based on the set of responses, and the determination of the presence or absence of the anomaly, and store the first diagnostic information therein. The controller implements a finite state machine (FSM) for the determination of the presence or absence of the anomaly and the generation of the first diagnostic information.

In some examples, the SoC further includes a master element that is coupled with the controller, and is configured to generate the test initiation request and receive the first and second diagnostic information. The test initiation request includes test mode data indicating at least one of the first value and the second value, and test information associated with the plurality of critical components. The second select instruction includes the test mode data.

In some examples, the first value of the test mode data corresponds to a non-invasive test mode and the second value of the test mode data corresponds to an invasive test mode. In the non-invasive test mode, the masking circuit masks the set of responses, and in the invasive test mode, the masking circuit outputs the set of responses.

In some examples, the controller is further configured to store a pre-injection state of the plurality of critical components, and revert the plurality of critical components to the pre-injection state after the set of responses is masked. The pre-injection state includes logic states of each of the plurality of critical components before the testing of the plurality of critical components.

In some examples, the master element is further configured to execute at least one of a boot code and an application code. The test initiation request is received by the controller during the execution of at least one of the boot code and the application code. The testing of the plurality of critical components and the execution of the boot code are performed parallelly.

In some examples, the plurality of critical components further comprise a plurality of processing circuits that are coupled with the controller and the masking circuit, and are configured to receive the set of responses when the second select instruction indicates the second value, and generate a plurality of output signals.

In some examples, the controller is further configured to receive the plurality of output signals and determine a reaction of each processing circuit based on a corresponding output signal of the plurality of output signals. The controller is further configured to generate second diagnostic information based on the determined reaction of each processing circuit. The reaction of each processing circuit is associated with testing of a corresponding processing circuit of the plurality of processing circuits.

In some examples, the controller is further configured to generate first and second notifications that indicate initiation and completion of the testing of the plurality of critical components, respectively, and provide the first and second notifications to an external processor.

In some examples, the IP core is further configured to detect a first fault event of the set of fault events. The IP core generates a first response of the set of responses based on the detected first fault event.

In some examples, when the IP core is at least one of a clock monitoring circuit and a reset circuit, the logic circuit is at least one of a clock tree and a reset tree, and the first fault event corresponds to at least one of an absence of a clock signal and a system clock failure.

In some examples, the fault injector includes a fault generator and a first set of multiplexers coupled with the fault generator. The fault generator is configured to receive the set of input signals and generate the set of fault inputs. Each multiplexer of the first set of multiplexers is configured to receive the first select instruction and a subset of fault inputs of the set of fault inputs, and select and inject a first fault input of the subset of fault inputs in the logic circuit based on the first select instruction.

In some examples, the masking circuit includes a second set of multiplexers. Each multiplexer of the second set of multiplexers is configured to receive the second select instruction and a subset of responses of the set of responses, and select and output a first response of the subset of responses based on the second select instruction In some examples, the SoC further includes a logic built-in self-test (LBIST) circuit that is coupled with the fault injector and the masking circuit. The LBIST circuit is configured to generate first and second sets of test signals, provide the first set of test signals to the fault injector, and the second set of test signals to the masking circuit, and receive first and second sets of detection signals in response to the first and second sets of test signals. The first set of test signals is indicative of testing the fault injector, and the second set of test signals is indicative of testing the masking circuit.

In some examples, the fault injector is further configured to receive the first set of test signals and generate the first set of detection signals, and the masking circuit is further configured to receive the second set of test signals and generate the second set of detection signals.

Various embodiments of the present disclosure disclose a system-on-chip (SoC) and a method for testing critical components of the SoC by a testing system of the SoC. The critical components include intellectual property (IP) core and associated logic circuit. The testing system includes a controller, fault injector, and masking circuit. The controller is configured to receive a test initiation request and generate first and second select instructions. The fault injector is configured to receive a set of input signals and the first select instruction, and generate and inject a set of fault inputs in the logic circuit to test the logic circuit and the associated IP core. The logic circuit is configured to generate a set of fault events, and the IP core is configured to receive the set of fault events generated by the associated logic circuit and generate a set of responses. The set of responses is associated with the testing of the logic circuit and the associated IP core. The masking circuit is configured to receive the set of responses and the second select instruction. The masking circuit is further configured to mask the set of responses when the second select instruction indicates a first value (i.e., a non-invasive test mode), and output the set of responses when the second select instruction indicates a second value (i.e., an invasive test mode) such that the set of responses propagate through multiple processing circuits of the critical components and the testing system tests the processing circuits based on a reaction of each processing circuit in response to the set of responses.

The fault injector of the testing system generates and injects the set of fault inputs in the logic circuit to test the logic circuit and the associated IP core as compared to the conventional testing system that injects fault inputs directly in the IP core. Thus, the logic circuit that may be in a path through which the fault inputs propagate to the IP core, is tested. Further, the testing system tests the processing circuits based on the reaction of each processing circuit in response to the set of responses. As the testing system of the SoC is capable of testing the critical components that are in path of the IP core, i.e., the logic and processing circuits that are associated with the IP core, the testing system hence provides an end-to-end test coverage. Further, the fault injector and the masking circuit require less area than the conventional LBIST system that is implemented for testing the critical components. Additionally, the SoC is not required to be reset each time after the testing by the testing system is complete. Thus, the speed of operation and an availability of the SoC to perform regular operations is improved as compared to an SoC utilizing the conventional testing system.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

FIGS. 3A-3E, collectively, represent a flow chart that illustrates a method for testing a plurality of critical components of the SoC of FIG. 1 in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
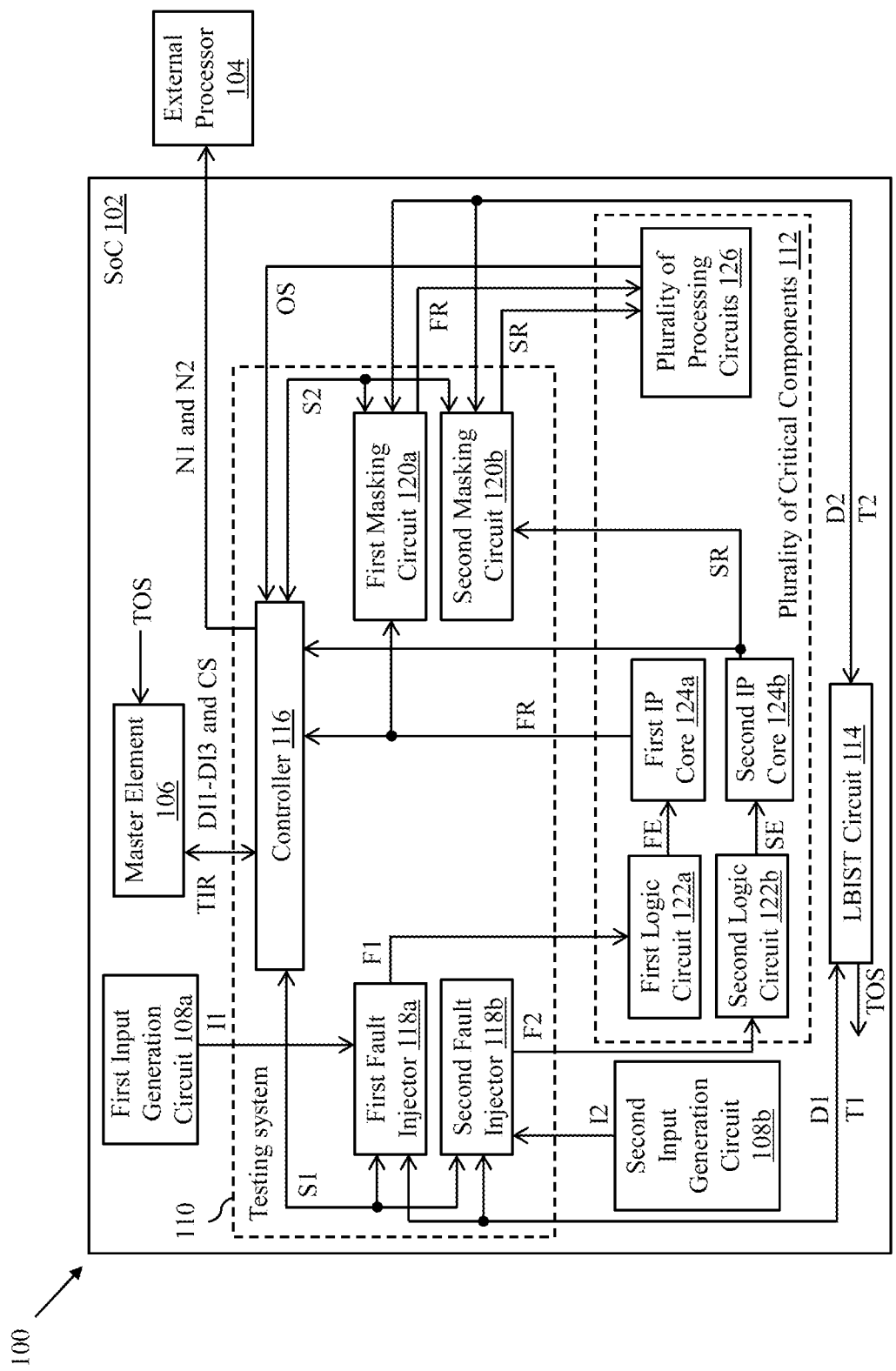
FIG. 1 is a block diagram of a system-on-chip (SoC) and an external processor in accordance with an embodiment of the present disclosure.

FIG. 1 is a block diagram 100 of a system-on-chip (SoC) 102 and an external processor 104 in accordance with an embodiment of the present disclosure. The SoC 102 is a multi-core SoC that may be utilized in an automotive application such as an advanced driver assistance system (ADAS), a consumer application such as a home security system, or an industrial application such as an industrial robotic system. The SoC 102 includes a master element 106, first and second input generation circuits 108a and 108b, a testing system 110, a plurality of critical components 112, and a logic built-in self-test (LBIST) circuit 114.

The master element 106 may be implemented by way of a processing core (not shown) or a controller circuit (not shown). The master element 106 is configured to execute at least one of a boot code and an application code. The boot code includes instructions associated with booting operations of the SoC 102 when the SoC 102 is powered-on. The application code includes instructions associated with running an application, such as an ADAS application, on the SoC 102. The master element 106 is coupled with the testing system 110, and is further configured to generate a test initiation request TIR. The test initiation request TIR is generated by the master element 106 to test the plurality of critical components 112 by way of the testing system 110. The test initiation request TIR includes test mode data indicating at least one of a first value and a second value, and test information associated with the plurality of critical components 112. The first value of the test mode data corresponds to a non-invasive test mode and the second value of the test mode data corresponds to an invasive test mode. The test information includes information regarding fault inputs that need to be injected in the plurality of critical components 112. The plurality of critical components 112 generate responses based on the injected fault inputs. The testing system 110 is configured to output the generated responses (i.e., the testing system 110 does not mask the generated responses), in the invasive test mode, and mask the generated responses, i.e., not output the generated responses, in the non-invasive test mode.

The first and second input generation circuits 108a and 108b are configured to generate first and second sets of input signals I1 and I2, respectively. The first and second input generation circuits 108a and 108b are coupled with the testing system 110, and are further configured to provide the first and second sets of input signals I1 and I2 to the testing system 110. In one example, the first input generation circuit 108a is a clock source, and a first input signal of the first set of input signals I1 is a clock signal that has a pre-defined frequency. Further, the second input generation circuit 108b is a reset source, and a first input signal of the second set of input signals I2 is a reset signal and a second input signal of the second set of input signals I2 is an oscillator failure signal. In another example, the first input generation circuit 108a is a power supply generator, and a first input signal of the first set of input signals I1 is a power supply signal that has a pre-defined voltage level.

The testing system 110 is coupled with the master element 106, and is configured to receive the test initiation request TIR. The testing system 110 is further configured to test the plurality of critical components 112 based on the received test initiation request TIR. In one example, for testing the plurality of critical components 112, the testing system 110 is configured to create and observe critical fault events in a design of the plurality of critical components 112. The testing system 110 includes a controller 116, a plurality of fault injectors of which first and second fault injectors 118a and 118b are shown, and a plurality of masking circuits of which first and second masking circuits 120a and 120b are shown.

The controller 116 is coupled with the master element 106, and is configured to receive the test initiation request TIR and generate first and second select instructions S1 and S2. The test initiation request TIR is received by the controller 116 during the execution of one of the boot code and the application code by the master element 106. In one embodiment, when the testing of the plurality of critical components 112 by the testing system 110 is performed periodically or when triggered by the master element 106 during the execution of the application code by the master element 106, the test mode data indicates one of the first value and the second value, i.e., one of the invasive test mode and the non-invasive test mode, to the controller 116. In one example, during the execution of the application code, the controller 116 is further configured to receive a mode selection signal (not shown) from the master element 106 such that when the mode selection signal is activated and deactivated, the test mode data indicates the invasive test mode and the non-invasive test mode, respectively. In another embodiment, when the testing of the plurality of critical components 112 by the testing system 110 and the execution of the boot code by the master element 106 are performed parallelly, the test mode data indicates the first value, i.e., the non-invasive test mode, to the controller 116. The controller 116 may include programmable logic circuit (not shown), logic gates (not shown), flip-flops (not shown), relays (not shown), and registers (not shown) to implement a finite state machine (FSM) to execute the functions of the controller 116 as described in the specification.

The controller 116 may be configured to store a pre-injection state of the plurality of critical components 112. The pre-injection state includes logic states of each of the plurality of critical components 112 before the testing of the plurality of critical components 112. The controller 116 may be configured to receive a plurality of state signals (not shown) from the plurality of critical components 112 such that the plurality of state signals indicate the logic states of the plurality of critical components 112. The controller 116 may be configured to revert the plurality of critical components 112 to the pre-injection state after masking the generated responses. To revert the plurality of critical components 112 to the pre-injection state, the controller 116 is further configured to generate and provide a plurality of revert signals (not shown) to the plurality of critical components 112 to revert the logic states of each of the plurality of critical components 112 to the pre-injection state.

The first and second select instructions S1 and S2 are generated based on the test initiation request TIR. Further, the second select instruction S2 includes the test mode data. The controller 116 is further configured to generate first and second notifications N1 and N2 that indicate initiation and completion of the testing of the plurality of critical components 112, respectively. Thus, the first notification N1 is generated when the controller 116 receives the test initiation request TIR, and the second notification N2 is generated when the testing of the plurality of critical components 112 is completed. The controller 116 is further configured to provide the first and second notifications N1 and N2 to the external processor 104.

The external processor 104 may be a processor of another SoC (not shown) that is dependent on SoC output signals (not shown) outputted by the SoC 102. The SoC output signals may be functional signals of the SoC 102. The external processor 104 is coupled with the controller 116, and is configured to receive the first and second notifications N1 and N2 that indicate the initiation and the completion of the testing of the plurality of critical components 112 of the SoC 102. Based on the first and second notifications N1 and N2, the external processor 104 may be configured to process the SoC output signals.

The first and second fault injectors 118a and 118b are coupled with the controller 116, and the first and second input generation circuits 108a and 108b, respectively. The first and second fault injectors 118a and 118b are configured to receive the first and second sets of input signals I1 and I2, respectively, and the first select instruction S1. The first and second fault injectors 118a and 118b are further configured to generate and inject first and second sets of fault inputs F1 and F2 in corresponding logic circuits of the plurality of critical components 112 to test the plurality of critical components 112, respectively. The first select instruction S1 determines the corresponding fault inputs of the first and second sets of fault inputs F1 and F2 that are to be outputted by the first and second fault injectors 118a and 118b, respectively. The plurality of critical components 112 generate first and second sets of responses FR and SR based on the first and second sets of fault inputs F1 and F2, respectively. The structure and working of the first fault injector 118a are explained in detail in conjunction with FIG. 2. Further, the second fault injector 118b is structurally and functionally similar to the first fault injector 118a.

It will be apparent to a person skilled in the art that although in the current embodiment, the plurality of fault injectors include two fault injectors, in an alternate embodiment, the plurality of fault injectors may include any number of fault injectors without deviating from the scope of the present disclosure.

The first and second masking circuits 120a and 120b are coupled with the controller 116 and the plurality of critical components 112. The first and second masking circuits 120a and 120b are configured to receive the first and second sets of responses FR and SR, respectively, and the second select instruction S2. The first and second sets of responses FR and SR are associated with the testing of the plurality of critical components 112. The first and second masking circuits 120a and 120b mask the first and second sets of responses FR and SR based on the second select instruction S2, respectively. When the test mode data in the second select instruction S2 indicates the first value, i.e., in the non-invasive test mode, the first and second masking circuits 120a and 120b mask the first and second sets of responses FR and SR, respectively. Further, the controller 116 reverts the plurality of critical components to the pre-injection state after the first and second sets of responses FR and SR are masked. When the test mode data in the second select instruction S2 indicates the second value, i.e., in the invasive test mode, the first and second masking circuits 120a and 120b are further configured to output the first and second sets of responses FR and SR, respectively.

It will be apparent to a person skilled in the art that although in the current embodiment, the plurality of masking circuits include two masking circuits, in an alternate embodiment, the plurality of masking circuits include any number of masking circuits such that a number of masking circuits is equal to a number of fault injector circuits without deviating from the scope of the present disclosure.

The plurality of critical components 112 are coupled with the testing system 110, and are configured to receive the first and second sets of fault inputs F1 and F2. The plurality of critical components 112 include a plurality of logic circuits of which first and second logic circuits 122a and 122b are shown, a plurality of intellectual property (IP) cores of which first and second IP cores 124a and 124b are shown, and a plurality of processing circuits 126.

The first and second logic circuits 122a and 122b are coupled with the first and second fault injectors 118a and 118b, respectively. The first and second logic circuits 122a and 122b are injected with the first and second sets of fault inputs F1 and F2, and are configured to generate first and second sets of fault events FE and SE, respectively. Thus, the first set of fault events FE is associated with the testing of the first logic circuit 122a, and is a reaction of the first logic circuit 122a to the first set of fault inputs F1 injected in the first logic circuit 122a. The reaction of the first logic circuit 122a to a corresponding injected fault input of the first set of fault inputs F1 is explained in detail in FIG. 2. Similarly, the second set of fault events SE is associated with the testing of the second logic circuit 122b and is a reaction of the second logic circuit 122b to the second set of fault inputs F2 injected in the second logic circuit 122b. The first logic circuit 122a includes an arrangement of logic circuits (i.e., logic gates, and combinational and sequential circuitry) that are configured to react to the injected fault and generate a reaction to the injected fault based on an anomaly that is present or absent in the first logic circuit 122a. The second logic circuit 122b is structurally and functionally similar to the first logic circuit 122a.

It will be apparent to a person skilled in the art that although in the current embodiment, the plurality of logic circuits include two logic circuits, in an alternate embodiment, the plurality of logic circuits include any number of logic circuits such that a number of logic circuits is equal to a number of fault injector circuits without deviating from the scope of the present disclosure.

The first and second IP cores 124a and 124b are critical IP cores. Examples of the first and second IP cores 124a and 124b include a clock monitoring circuit, a reset generator, a watchdog circuit, an oscillator circuit, a phase-locked-loop (PLL) circuit, a digital frequency synthesizer circuit, a power supply monitoring circuit, and the like. The first and second IP cores 124a and 124b are coupled with the first and second logic circuits 122a and 122b, and are configured to receive the first and second sets of fault events FE and SE, respectively. The first fault injector 118a injects the first set of fault inputs F1 in the first logic circuit 122a to test the first logic circuit 122a and the first IP core 124a. Similarly, the second fault injector 118b injects the second set of fault inputs F2 in the second logic circuit 122b to test the second logic circuit 122b and the second IP core 124b. The first and second IP cores 124a and 124b are configured to generate the first and second sets of responses FR and SR, respectively. Thus, the first set of responses FR is associated with the testing of the first logic circuit 122a and the first IP core 124a, and is a reaction of the first IP core 124a to the received first set of fault events FE. Similarly, the second set of responses SR is associated with the testing of the second logic circuit 122b and the second IP core 124b, and is a reaction of the second IP core 124b to the received second set of fault events SE.

To generate a corresponding response of the first and second sets of responses FR and SR, the first and second IP cores 124a and 124b are further configured to detect each fault event from the first and second sets of fault events FE and SE, respectively. In one example, when the first IP core 124a is a clock monitoring circuit, the first logic circuit 122a is a clock tree, and a first fault event of the first set of fault events FE corresponds to an absence of a clock signal in the SoC 102, the first IP core 124a thus detects that the first fault event from the first set of fault events FE indicates the absence of the clock signal. Based on the detected first fault event, the first IP core 124a generates a first response of the first set of responses FR. In one scenario, when the first IP core 124*a* operates normally, the first IP core 124*a* is able to precisely detect the first fault event the first response may precisely indicate the reaction of the first IP core 124*a* to the detected first fault event. In another scenario, when the first IP core 124*a* does not operate normally, the first IP core 124*a* may not be able to precisely detect the first fault event and the first response may not precisely indicate the reaction of the first IP core 124*a* to the first fault event. Similarly, the second IP core 124*b* detects a corresponding fault event in the second set of fault events SE and generates a corresponding reaction, i.e., a corresponding response of the second set of responses SR. In one example, when the second IP core 124*b* is a reset generator, the second logic circuit 122*b* is a reset tree, and a second fault event of the second set of fault events SE corresponds to a system clock failure, the second IP core 124*b* detects the second fault event from the second set of fault events SE. Based on the detected second fault event, the second IP core 124*b* generates a second response of the second set of responses SR.

The first and second IP cores 124*a* and 124*b* may implement a finite state machine (FSM) to detect the first and second sets of fault events FE and SE and generate the first and second sets of responses FR and SR, respectively. The first and second IP cores 124*a* and 124*b* are coupled with the controller 116, and are configured to provide the first and second sets of responses FR and SR to the controller 116, respectively.

It will be apparent to a person skilled in the art that although in the current embodiment, the plurality of IP cores include two IP cores, in an alternate embodiment, the plurality of IP cores include any number of IP cores such that a number of fault injector circuits is equal to a number of IP cores without deviating from the scope of the present disclosure.

The controller 116 is further configured to receive the first and second sets of responses FR and SR from the first and second IP cores 124*a* and 124*b*, respectively. Based on the first set of responses FR, the controller 116 is further configured to determine whether an anomaly such as a first anomaly is present or absent in at least one of the first logic circuit 122*a* and the first IP core 124*a*, i.e., whether at least one of the first logic circuit 122*a* and the first IP core 124*a* is anomalous or both the first logic circuit 122*a* and the first IP core 124*a* are anomalous. The first anomaly corresponds to an unexpected behavior in the operation of at least one of the first logic circuit 122*a* and the first IP core 124*a*. Similarly, based on the second set of responses SR, the controller 116 is further configured to determine whether an anomaly such as a second anomaly is present or absent in at least one of the second logic circuit 122*b* and the second IP core 124*b*, i.e., whether at least one of the second logic circuit 122*b* and the second IP core 124*b* is anomalous or both the second logic circuit 122*b* and the second IP core 124*b* are anomalous. The second anomaly corresponds to an unexpected behavior in the operation of at least one of the second logic circuit 122*b* and the second IP core 124*b*.

The controller 116 implements an FSM for the determination of the presence or absence of the first anomaly in at least one of the first logic circuit 122*a* and the first IP core 124*a*, and the second anomaly in at least one of the second logic circuit 122*b* and the second IP core 124*b*. In one embodiment, to determine whether the first anomaly is present or absent, the controller 116 is configured to compare the first set of responses FR with an expected first set of responses (not shown) that is stored in a memory (not shown) associated with the controller 116. The memory may be internal or external to the controller 116. The expected first set of responses may include first and second subsets of expected responses that are associated with historical reactions of both the first logic circuit 122*a* and the first IP core 124*a* when the first logic circuit 122*a* and the first IP core 124*a* are injected with known faults that are generated by the first fault injector 118*a*, respectively. In an example, when the controller 116 determines that a first subset of responses of the first set of responses FR does not match the first subset of expected responses but a second subset of responses of the first set of responses FR matches the second subset of expected responses, the controller 116 determines that the first anomaly is present in the first logic circuit 122*a* and the first IP core 124*a* is functioning normally. In another example, when the controller 116 determines that the second subset of responses does not match the second subset of expected responses but the first subset of responses matches the first subset of expected responses, the controller 116 determines that the first anomaly is present in the first IP core 124*a*, and the first logic circuit 122*a* is functioning normally. In yet another example, when the controller 116 determines that both the first and second subsets of responses do not match both the first and second subsets of expected responses, respectively, the controller 116 determines that the first anomaly is present in both the first logic circuit 122*a* and the first IP core 124*a*. In yet another example, when the controller 116 determines that both the first and second subsets of responses match both the first and second subsets of expected responses, the controller 116 determines that the first anomaly is not present in either of the first logic circuit 122*a* and the first IP core 124*a*, and both the first logic circuit 122*a* and the first IP core 124*a* are functioning normally. Similarly, the controller 116 determines whether the second anomaly is present or absent in at least one of the second logic circuit 122*b* and the second IP core 124*b*.

The controller 116 is further configured to generate a set of control signals CS based on the determination of the presence or absence of the first and second anomalies. In one embodiment, the set of control signals CS is generated at logic high state to indicate to the master element 106, the actions to be executed based on the presence of the anomaly in at least one of the first and second logic circuits 122*a* and 122*b* and the first and second IP cores 124*a* and 124*b*. In one example, when the first or second anomaly is present, a first control signal (e.g., a power-on reset signal) of the set of control signals CS is generated at logic high state, and indicates the master element 106 to reset the SoC 102. Further, a second control signal of the set of control signals CS is one of destructive and functional reset signals, and is indicative of destructive or functional reset when generated at logic high state. The controller 116 generates the set of control signals CS at logic low state when the first and second sets of responses FR and SR match the expected first and second sets of responses, respectively.

In another embodiment, when the controller 116 determines the presence or absence of the first anomaly in at least one of the first logic circuit 122*a* and the first IP core 124*a*, and the second anomaly in at least one of the second logic circuit 122*b* and the second IP core 124*b*, the controller 116 activates or deactivates a corresponding control signal of the set of control signals CS. In one example, the controller 116 activates a first control signal of the set of control signals CS when the controller 116 determines the presence of the first anomaly in the first logic circuit 122*a* and deactivates the first control signal when the controller 116 determines the absence of the first anomaly in the first logic circuit 122*a*. Similarly, the controller 116 activates second through fourth control signals of the set of control signals CS when the controller 116 determines the presence of the first anomaly in the first IP core 124a, and the second anomaly in the second logic circuit 122b and the second IP core 124b, respectively, and deactivates the second through fourth control signals when the controller 116 determines the absence of the first anomaly in the first IP core 124a, and the second anomaly in the second logic circuit 122b and the second IP core 124b. Thus, the activation and deactivation of the first through fourth control signals of the set of control signals CS indicate the presence or absence of the anomalies in the first logic circuit 122a, the first IP core 124a, the second logic circuit 122b, and the second IP core 124b, respectively.

The controller 116 is further configured to generate first and second diagnostic information DI1 and DI2 based on the first and second sets of responses FR and SR, and the determination of the presence or absence of the first and second anomalies, respectively. In one embodiment, the first diagnostic information DI1 may include a type of anomaly, such as a functional or structural anomaly, present in at least one of the first logic circuit 122a and the first IP core 124a. Similarly, the second diagnostic information DI2 may include a type of anomaly present in at least one of the second logic circuit 122b and the second IP core 124b. The controller 116 further implements the FSM to generate the first and second diagnostic information DI1 and DI2, respectively. The controller 116 is further configured to store the first and second diagnostic information DI1 and DI2 therein, i.e., in a memory internal to the controller 116.

The controller 116 is further configured to provide the first and second diagnostic information DI1 and DI2 and the set of control signals CS to the master element 106. The master element 106 is further configured to process and execute a set of actions based on the set of control signals CS and the first and second diagnostic information DI1 and DI2 for debugging the SoC 102 and to correct the first anomaly that may be present in at least one of the first logic circuit 122a and the first IP core 124a, and the second anomaly that may be present in at least one of the second logic circuit 122b and the second IP core 124b. In one example, based on the first and second diagnostic information DI1 and DI2 and the activated first control signal, the master element 106 resets the SoC 102. In another example, based on the first and second diagnostic information DI1 and DI2 and the number of activated control signals in the set of control signals CS, the master element 106 may further communicate with a correction circuitry (not shown) on the SoC 102 to correct the detected anomalies in at least one of the first and second logic circuits 122a and 122b and the first and second IP cores 124a and 124b. Thus, when the first control signal is activated to indicate the presence of the first anomaly in the first logic circuit 122a, the correction circuitry may correct the first anomaly in the first logic circuit 122a.

The plurality of processing circuits 126 are coupled with the controller 116 and the first and second masking circuits 120a and 120b. Examples of the plurality of processing circuits 126 include, but are not limited to, fault collection and control circuits and reset circuits. The plurality of processing circuits 126 are configured to receive, based on the second select instruction S2, the first and second sets of responses FR and SR from the first and second masking circuits 120a and 120b, respectively. When the test mode data in the second select instruction S2 indicates the second value (i.e., the invasive test mode), the first and second masking circuits 120a and 120b output the first and second sets of responses FR and SR to provide the first and second sets of responses FR and SR to the plurality of processing circuits 126. The plurality of processing circuits 126 thus receive the first and second sets of responses FR and SR. The plurality of processing circuits 126 are further configured to generate a plurality of output signals OS based on the received first and second sets of responses FR and SR. The plurality of output signals OS thus indicate a reaction of the plurality of processing circuits 126 in response to the received first and second sets of responses FR and SR.

The controller 116 is further configured to receive the plurality of output signals OS and determine a reaction of each processing circuit based on a corresponding output signal of the plurality of output signals OS. The reaction of each processing circuit is associated with testing of a corresponding processing circuit of the plurality of processing circuits 126. The controller 116 is further configured to generate third diagnostic information DI3 based on the determined reaction of each processing circuit, and provide the third diagnostic information DI3 to the master element 106. The third diagnostic information DI3 includes the determined reaction of each processing circuit.

The LBIST circuit 114 is coupled with the first and second fault injectors 118a and 118b and the first and second masking circuits 120a and 120b. The LBIST circuit 114 is configured to generate first and second sets of test signals T1 and T2, provide the first set of test signals T1 to the first and second fault injectors 118a and 118b, and the second set of test signals T2 to the first and second masking circuits 120a and 120b. The first set of test signals T1 is indicative of testing the first and second fault injectors 118a and 118b by the LBIST circuit 114, and the second set of test signals T2 is indicative of testing the first and second masking circuits 120a and 120b by the LBIST circuit 114. In one example, the LBIST circuit 114 tests the first and second fault injectors 118a and 118b and the first and second masking circuits 120a and 120b before the testing system 110 tests the plurality of critical components 112. The LBIST circuit 114 may further test the first and second fault injectors 118a and 118b and the first and second masking circuits 120a and 120b after the testing system 110 tests the plurality of critical components 112.

The first and second fault injectors 118a and 118b are further configured to receive the first set of test signals T1 and generate a first set of detection signals D1 in response to the first set of test signals T1. The first and second masking circuits 120a and 120b are further configured to receive the second set of test signals T2 and generate a second set of detection signals D2 in response to the second set of test signals T2. The LBIST circuit 114 is further configured to receive the first and second sets of detection signals D1 and D2 in response to the first and second sets of test signals T1 and T2. In one example, the first set of test signals T1 includes first and second test signals that are provided to test the first and second fault injectors 118a and 118b, respectively. Similarly, the first set of detection signals D1 includes first and second detection signals that are generated by the first and second fault injectors 118a and 118b in response to the first and second test signals, respectively. In another example, the second set of test signals T2 includes third and fourth test signals that are provided to test the first and second masking circuits 120a and 120b, respectively. Similarly, the second set of detection signals D2 includes third and fourth detection signals that are generated by the first and second masking circuits 120a and 120b in response to the third and fourth test signals, respectively.

The LBIST circuit 114 is further configured to determine whether the first and second fault injectors 118a and 118b are faulty based on the first set of detection signals D1, and whether the first and second masking circuits 120a and 120b are faulty based on the second set of detection signals D2. In one example, when the first and second detection signals indicate faults, the LBIST circuit 114 determines that the first and second fault injectors 118a and 118b are faulty, respectively. In another example, when the first and second detection signals do not indicate any fault, the LBIST circuit 114 determines that the first and second fault injectors 118a and 118b are not faulty. Similarly, the LBIST circuit 114 determines whether the first and second masking circuits 120a and 120b are faulty. In one embodiment, when any of the first and second fault injectors 118a and 118b and the first and second masking circuits 120a and 120b is faulty, the LBIST circuit 114 is further configured to indicate to the master element 106 that which of the first and second fault injectors 118a and 118b and the first and second masking circuits 120a and 120b is faulty, by generating and providing a test output signal TOS to the master element 106. Based on the test output signal TOS, the master element 106 is further configured to process and utilize the faults detected by the LBIST circuit 114. Further, the master element 106 is configured to execute actions to correct the detected faults in the first and second fault injectors 118a and 118b and the first and second masking circuits 120a and 120b for debugging the testing system 110 and to ensure that any fault in the testing system 110 does not occur in the testing of the plurality of critical components 112.

Figure 2:
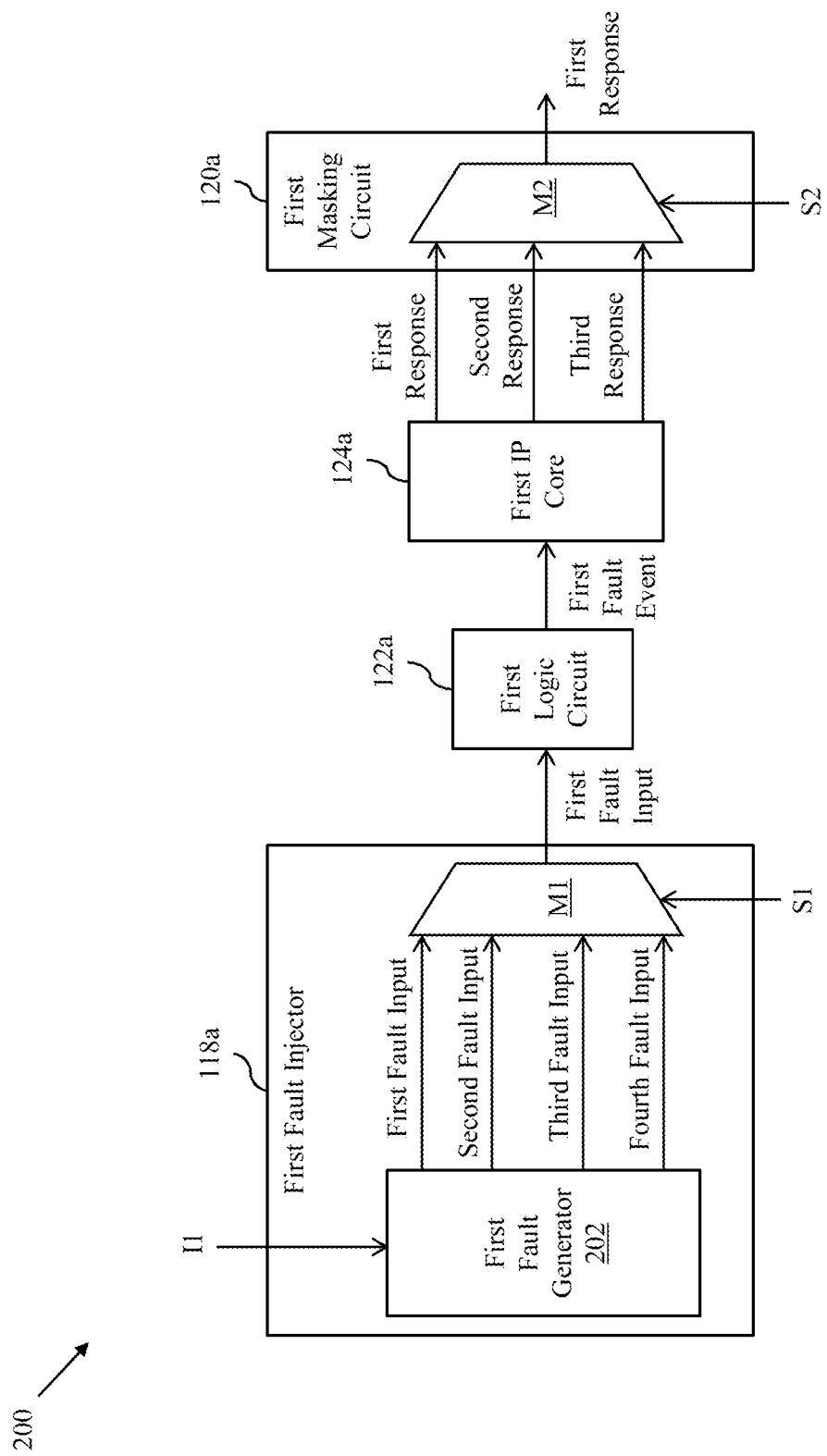
FIG. 2 is a block diagram that illustrates testing of a first logic circuit and a first IP core of the SoC of FIG. 1 in accordance with an embodiment of the present disclosure.
Figure 3A:
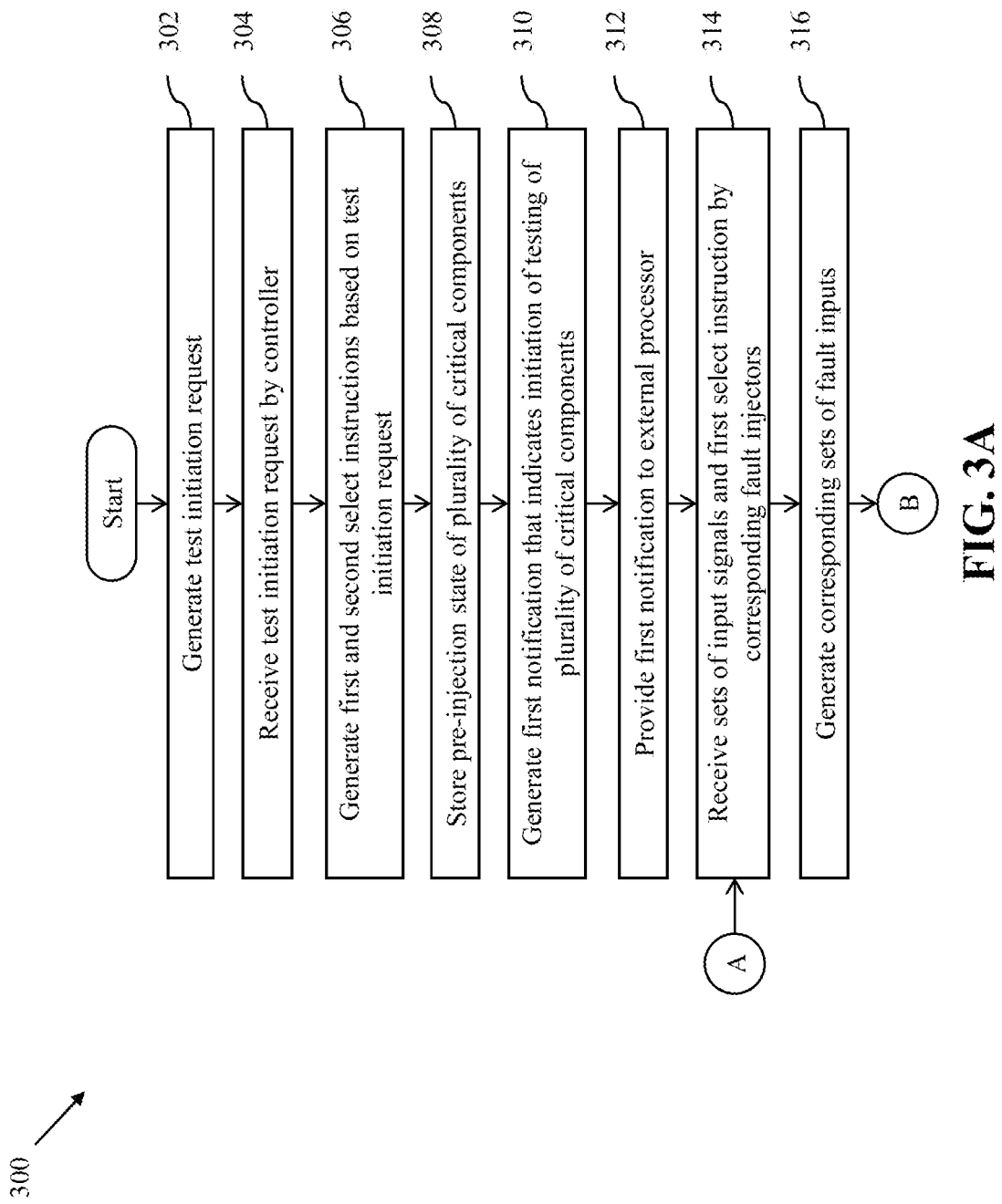
Figure 3C:
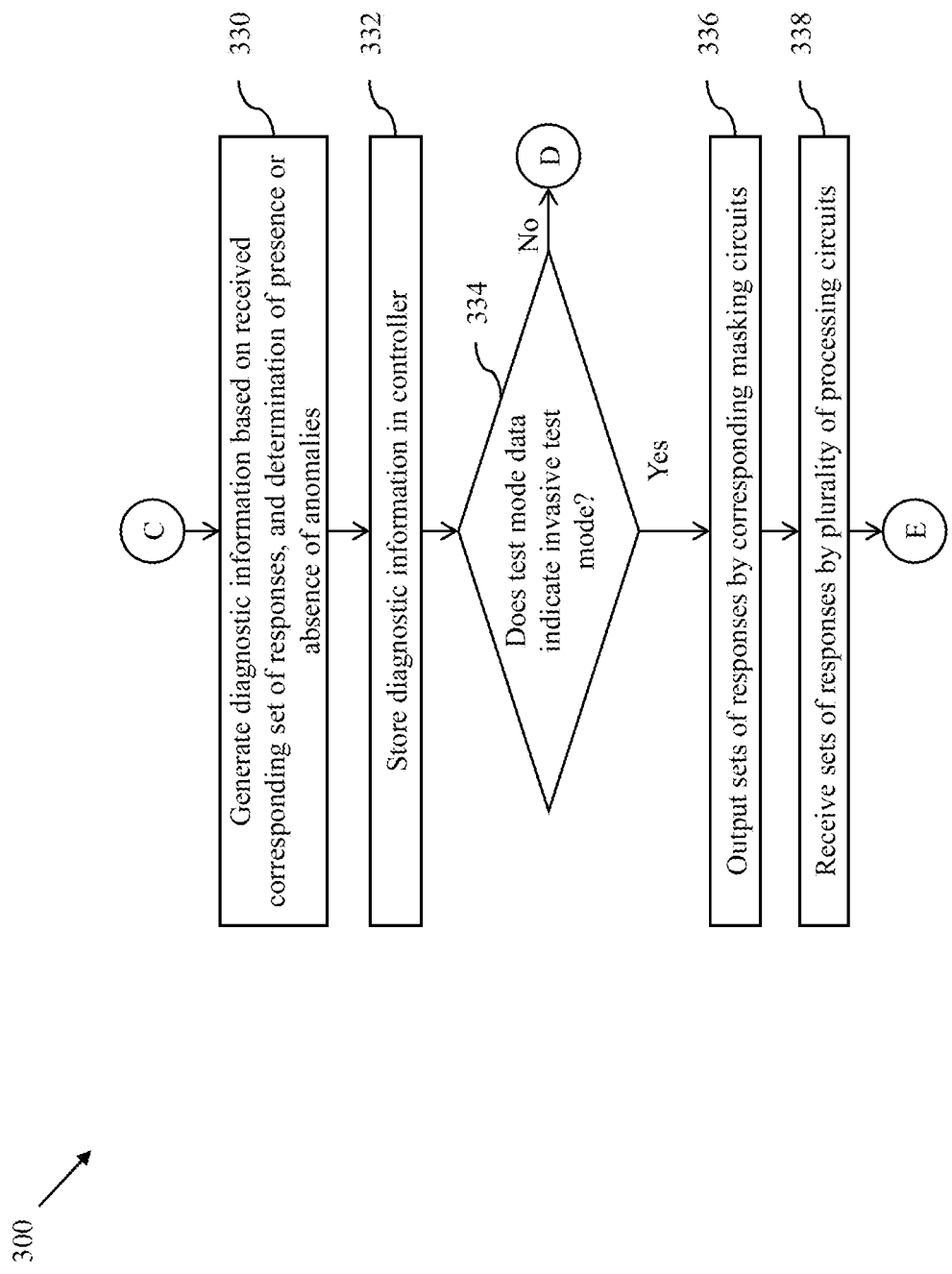
Figure 3E:
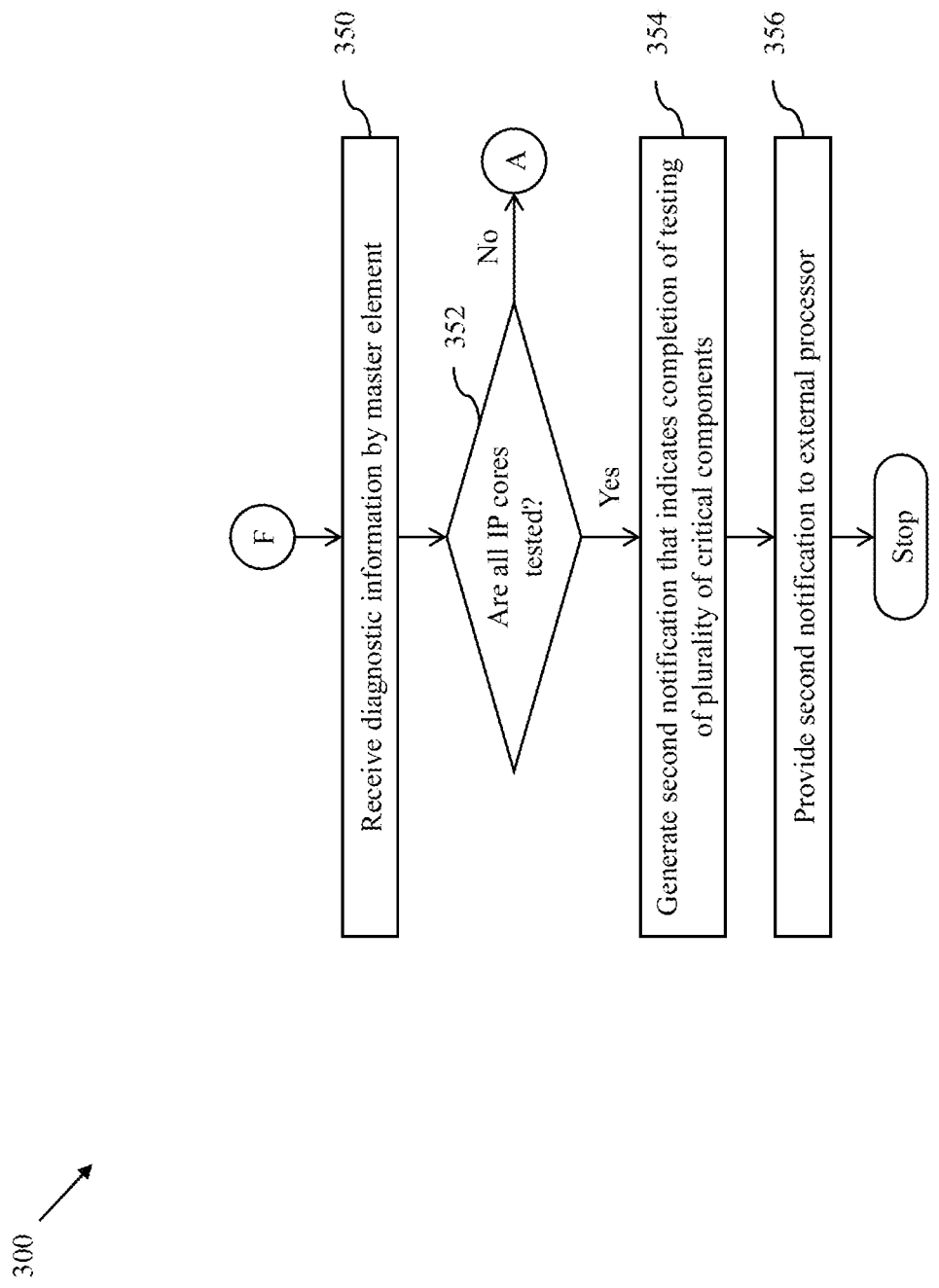

FIG. 2 is a block diagram 200 illustrating the testing of the first logic circuit 122a and the first IP core 124a in accordance with an embodiment of the present disclosure. The block diagram 200 includes the first fault injector 118a, the first masking circuit 120a, the first logic circuit 122a, and the first IP core 124a.

The first fault injector 118a includes a first fault generator 202 and a first set of multiplexers of which a first multiplexer M1 is shown. The first fault generator 202 is coupled with the first input generation circuit 108a, and is configured to receive the first set of input signals I1 and generate the first set of fault inputs F1 of which first through fourth fault inputs are shown. In one example, the first input generation circuit 108a is a clock source such as an oscillator, and a first input signal of the first set of input signals I1 is a clock signal that has a pre-defined frequency. The first fault generator 202 receives the clock signal as the first input signal, and generates a zero-clock signal as the first fault input, a no-fault clock signal as the second fault input, a divided-frequency clock signal as the third fault input, and a multiplied-frequency clock signal as the fourth fault input. The first fault generator 202 may include frequency divider and multiplier circuits (not shown) that receive the clock signal and generate the divided-frequency clock signal and multiplied-frequency clock signal, respectively.

Each multiplexer of the first set of multiplexers is coupled with the first fault generator 202, and is configured to receive the first select instruction S1 and a subset of fault inputs of the first set of fault inputs F1, and select and inject a first fault input of the subset of fault inputs in the first logic circuit 122a based on the first select instruction S1. As shown in FIG. 2, the first multiplexer M1 is coupled with the first fault generator 202, and is configured to receive the first through fourth fault inputs as the subset of fault inputs, and the first select instruction S1. The first select instruction S1 is generated based on the test initiation request TIR that includes the test information. The first multiplexer M1 is further configured to select and inject a fault input such as the first fault input, i.e., the zero-clock signal, in the first logic circuit 122a.

The first logic circuit 122a is coupled with the first multiplexer M1, and is configured to receive the zero-clock signal as the first fault input and generate an absence of the clock signal as the first fault event. The first IP core 124a is coupled with the first logic circuit 122a and is configured to receive the first fault event, i.e., the absence of the clock signal. The first IP core 124a receives the first fault event and generate a subset of responses of the first set of responses FR. The subset of responses includes first through third responses such that the first response corresponds to a frequency of the received zero-clock signal that is lower than a pre-defined threshold, the second response corresponds to a frequency of the received zero-clock signal that is higher than the pre-defined threshold, and the third response corresponds to a zero frequency clock signal, i.e., an absence of the clock signal on the SoC 102. In one example, the first IP core 124a generates the first and second responses at logic low state and the third response at logic high state, to indicate that the first fault event, i.e., the absence of the clock signal, is detected successfully by the first IP core 124a, and the first logic circuit 122a and the first IP core 124a are working normally. In another example, the first IP core 124a generates the second and third responses at logic low state and the first response at logic high state, thereby indicating that the first IP core 124a failed to detect the first fault event, i.e., the absence of the clock signal, and at least one of the first logic circuit 122a and the first IP core 124a is anomalous. Similarly, remaining multiplexers of the first set of multiplexers inject corresponding fault inputs in the first logic circuit 122a based on the first select instruction S1. The first logic circuit 122a generates fault events based on the injected corresponding fault inputs and the first IP core 124a generates responses corresponding to the fault events generated by the first logic circuit 122a.

The first masking circuit 120a includes a second set of multiplexers of which a second multiplexer M2 is shown. Each multiplexer of the second set of multiplexers is coupled with the first IP core 124a, and is configured to receive the second select instruction S2 and the corresponding subset of responses of the first set of responses FR. When the test mode data in the second select instruction S2 indicates the non-invasive test mode, each multiplexer of the second set of multiplexers is configured to mask the subset of responses, i.e., the subset of responses is not outputted. When the test mode data in the second select instruction S2 indicates the invasive test mode, each multiplexer of the second set of multiplexers is configured to select and output a corresponding first response of the subset of responses based on the second select instruction S2. The second select instruction may further include select data such that each multiplexer of the second set of multiplexers selects and outputs a corresponding first response of the subset of responses based on the select data. As shown in FIG. 2, the second multiplexer M2 is coupled with the first IP core 124a, and is configured to receive the first through third responses as the subset of responses, and the second select instruction S2. The second multiplexer M2 is further configured to mask the first through third responses when the test mode data in the second select instruction S2 indicates the non-invasive test mode. The second multiplexer M2 is further configured to select and output the first response when the test mode data in the second select instruction S2 indicates the invasive test mode. Similarly, remaining multiplexers of the second set of multiplexers receive corresponding responses from the first IP core 124a and mask or select and output the corresponding responses based on the second select instruction S2.

FIGS. 3A-3E, collectively, represent a flow chart 300 illustrating a method for testing the plurality of critical components 112 of the SoC 102 in accordance with an embodiment of the present disclosure. The method for testing the plurality of critical components 112 may be utilized to test the plurality of critical components 112 by the controller 116 when the master element 106 is executing at least one of the boot code and the application code. Further, the method for testing the plurality of critical components 112 may be utilized at different stages, such as verification, emulation, testing, validation, and customer code development stages, to test the plurality of critical components 112.

At step 302, the master element 106 generates the test initiation request TIR. At step 304, the controller 116 receives the test initiation request TIR. At step 306, the controller 116 generates the first and second select instructions S1 and S2 based on the test initiation request TIR. At step 308, the controller 116 stores the pre-injection state of the plurality of critical components 112. The controller 116 may receive the plurality of state signals from the plurality of critical components 112 such that the plurality of state signals indicate the logic states of the plurality of critical components 112. At step 310, the controller 116 generates the first notification N1 that indicates the initiation of the testing of the plurality of critical components 112. At step 312, the controller 116 provides the first notification N1 to the external processor 104.

At step 314, fault injectors, such as the first and second fault injectors 118a and 118b, receive corresponding sets of inputs signals, such as the first and second sets of input signals I1 and I2, respectively, and the first select instruction S1. At step 316, the first and second fault injectors 118a and 118b generate the first and second sets of fault inputs F1 and F2, respectively. At step 318, the first and second fault injectors 118a and 118b inject the first and second sets of fault inputs F1 and F2 in the first and second logic circuits 122a and 122b to test the first and second logic circuits 122a and 122b and the first and second IP cores 124a and 124b, respectively.

At step 320, logic circuits, such as the first and second logic circuits 122a and 122b, generate corresponding sets of fault events, such as the first and second sets of fault events FE and SE, respectively. At step 322, the first IP core 124a generates the first set of responses FR based on the first set of fault events FE, and the second IP core 124b generates the second set of responses SR based on the second set of fault events SE.

At step 324, the controller 116 receives the first and second sets of responses FR and SR, and the first and second masking circuits 120a and 120b receive the first and second sets of responses FR and SR, respectively.

At step 326, the controller 116 determines whether the first anomaly is present in at least one of the first logic circuit 122a and the first IP core 124a based on the first set of responses FR, and the second anomaly is present in at least one of the second logic circuit 122b and the second IP core 124b based on the second set of responses SR. If at step 326, the controller 116 determines that the first anomaly is present in at least one of the first logic circuit 122a and the first IP core 124a, and the second anomaly is present in at least one of the second logic circuit 122b and the second IP core 124b, step 328 is executed. If at step 326, the controller 116 determines that the first anomaly is absent in at least one of the first logic circuit 122a and the first IP core 124a, and the second anomaly is absent in at least one of the second logic circuit 122b and the second IP core 124b, step 330 is executed.

At step 328, the controller 116 generates the set of control signals CS based on the determination of the presence of the first and second anomalies. At step 330, the controller 116 generates the first and second diagnostic information DI1 and DI2 based on the first and second sets of responses FR and SR, and the determination of the presence or absence of the first and second anomalies, respectively. At step 332, the controller 116 stores the first and second diagnostic information DI1 and DI2 therein.

At step 334, masking circuits, such as the first and second masking circuits 120a and 120b, determine whether the test mode data included in the second select instruction S2 indicates the second value, i.e., the invasive test mode. If at step 334, masking circuits, such as the first and second masking circuits 120a and 120b, determine that the test mode data included in the second select instruction S2 indicates the invasive test mode, steps 336-344 are executed. If at step 334, masking circuits, such as the first and second masking circuits 120a and 120b, determine that the test mode data included in the second select instruction S2 does not indicate the invasive test mode, i.e., indicates the non-invasive test mode, step 346 and 348 are executed.

At step 336, the first and second masking circuits 120a and 120b output the first and second sets of responses FR and SR, respectively. At step 338, the plurality of processing circuits 126 receive the first and second sets of responses FR and SR. At step 340, the plurality of processing circuits 126 generate the plurality of output signals OS.

At step 342, the controller 116 determines a reaction of each processing circuit based on a corresponding output signal of the plurality of output signals OS. At step 344, the controller 116 generates the third diagnostic information DI3 based on the determined reaction of each processing circuit.

At step 346, the first and second masking circuits 120a and 120b mask the first and second sets of responses FR and SR based on the second select instruction S2, respectively. The first and second sets of responses FR and SR are masked by the first and second masking circuits 120a and 120b, respectively, when the test mode data in the second select instruction S2 indicates the non-invasive test mode. At step 348, the controller 116 reverts the plurality of critical components 112 to the pre-injection state. The controller 116 may provide the plurality of revert signals to the plurality of critical components 112 to revert the logic states of each of the plurality of critical components 112 to the pre-injection state, after masking the generated responses when the test mode data indicates the non-invasive test mode. After steps 344 and 348, step 350 is executed.

At step 350, the master element 106 receives the third diagnostic information DI3. At step 352, the controller 116 determines whether all IP cores of the plurality of IP cores are tested. Thus, the controller 116 determines whether all the IP cores, such as the first and second IP cores 124a and 124b, and associated logic and processing circuits, such as the first and second logic circuits 122a and 122b and the plurality of processing circuits 126, are tested. If at step 352, the controller 116 determines that all IP cores of the plurality of IP cores are not tested, step 314-352 are executed continuously until all IP cores of the plurality of IP cores are tested. If at step 352, the controller 116 determines that all IP cores of the plurality of IP cores are tested, i.e., the plurality of critical components 112 are tested, step 354 is executed.

At step 354, the controller 116 generates the second notification N2 that indicates the completion of the testing of the plurality of critical components 112. At step 356, the controller 116 provides the second notification N2 to the external processor 104.

The first and second fault injectors 118a and 118b of the testing system 110 inject the first and second sets of fault inputs F1 and F2 in the first and second logic circuits 122a and 122b to test the first and second logic circuits 122a and 122b and the first and second IP cores 124a and 124b as compared to the conventional testing system that injects fault inputs directly in IP cores. Thus, all components of the first and second logic circuits 122a and 122b that are in a path through which the first and second sets of fault inputs F1 and F2 propagate are tested. Further, the testing system 110 tests the plurality of processing circuits 126 based on the reaction of each processing circuit in response to the first and second sets of responses FR and SR. Thus, the testing system 110 of the SoC 102 is capable of testing the plurality of critical components 112, i.e., the plurality of logic circuits, the plurality of IP cores, and the plurality of processing circuits 126, and provides an end-to-end test coverage. Additionally, the testing system 110 is capable of testing the plurality of critical components 112 that the conventional LBIST testing system failed to test as the plurality of critical components 112 need to be active to test other components on the SoC 102 for the conventional LBIST testing system. The fault injectors and masking circuits, i.e., the first and second fault injectors 118a and 118b and the first and second masking circuits 120a and 120b of the testing system 110, require less area than the conventional LBIST system that may be implemented for testing the critical components as the conventional LBIST system requires individual scan-chain circuits for testing each critical component. Additionally, a timing closure effort and a congestion resolution of the testing system 110 is low as compared to the conventional LBIST testing system. When the test mode data indicates the non-invasive test mode, the SoC 102 is not required to be reset each time after the testing is complete. Thus, the speed of operation and an availability of the SoC 102 to perform regular operations is improved as compared to an SoC utilizing the conventional LBIST system for testing the critical components. Further, when the test mode data indicates the invasive test mode, the first and second sets of responses FR and SR are outputted and propagated through the plurality of processing circuits 126. Thus, stress testing and pre-emptive check are performed on the plurality of critical components 112 when the test mode data indicates invasive test mode. As the testing of the plurality of critical components 112 by the testing system 110 and the execution of the boot code by the master element 106 is performed parallelly, the availability of the SoC 102 is further increased. Further, as the test mode data indicates the non-invasive test mode during the execution of the boot code, a safety of the SoC 102 is improved by masking the first and second sets of responses FR and SR. The testing system 110 may be utilized at different stages, such as verification, emulation, testing, validation, and customer code development stages, to test the plurality of critical components 112, thus, providing a robust and consistent solution for testing the plurality of critical components 112.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A system-on-chip (SoC), comprising:
 a plurality of critical components comprising:
  a logic circuit that is injected with a set of fault inputs, and is configured to generate a set of fault events; and
  an intellectual property (IP) core that is coupled with the logic circuit, and is configured to receive the set of fault events and generate a set of responses; and
 a testing system that is coupled with the plurality of critical components, the testing system comprising:
  a controller that is configured to receive a test initiation request and generate first and second select instructions;
  a fault injector that is coupled with the controller, and is configured to receive a set of input signals and the first select instruction, wherein the fault injector is further configured to generate and inject the set of fault inputs in the logic circuit to test the logic circuit and the IP core, and wherein the set of responses is associated with the testing of the logic circuit and the IP core; and
  a masking circuit that is coupled with the controller and the IP core, and is configured to receive the set of responses and the second select instruction, wherein the masking circuit is further configured to mask the set of responses when the second select instruction indicates a first value, and output the set of responses when the second select instruction indicates a second value.

2. The SoC of claim 1, wherein the controller is further configured to:
 receive the set of responses;
 determine whether an anomaly is present or absent in at least one of the logic circuit and the IP core based on the set of responses;
 generate a set of control signals based on the determination of the presence or absence of the anomaly, wherein when the anomaly is present, a first control signal of the set of control signals is a power-on reset signal, and indicates to reset the SoC;
 generate first diagnostic information based on the set of responses, and the determination of the presence or absence of the anomaly, wherein the controller implements a finite state machine (FSM) for the determination of the presence or absence of the anomaly and the generation of the first diagnostic information; and
 store the first diagnostic information therein.

3. The SoC of claim 2, further comprising:
 a master element that is coupled with the controller, and is configured to generate the test initiation request and receive the first diagnostic information, wherein the test initiation request includes test mode data indicating at least one of the first value and the second value, and test information associated with the plurality of critical components, and wherein the second select instruction includes the test mode data.

4. The SoC of claim 3, wherein the first value of the test mode data corresponds to a non-invasive test mode and the second value of the test mode data corresponds to an invasive test mode, and wherein in the non-invasive test mode, the masking circuit masks the set of responses, and in the invasive test mode, the masking circuit outputs the set of responses.

5. The SoC of claim 4, wherein the controller is further configured to store a pre-injection state of the plurality of critical components, and revert the plurality of critical components to the pre-injection state after the set of responses is masked, and wherein the pre-injection state includes logic states of each of the plurality of critical components before the testing of the plurality of critical components.

6. The SoC of claim 3, wherein the master element is further configured to execute at least one of a boot code and an application code, wherein the test initiation request is received by the controller during the execution of at least one of the boot code and the application code, and wherein the testing of the plurality of critical components and the execution of the boot code are performed parallelly.

7. The SoC of claim 1, wherein the plurality of critical components further comprise:
a plurality of processing circuits that are coupled with the controller and the masking circuit, and are configured to receive the set of responses when the second select instruction indicates the second value, and generate a plurality of output signals.

8. The SoC of claim 7, wherein the controller is further configured to:
receive the plurality of output signals;
determine a reaction of each processing circuit based on a corresponding output signal of the plurality of output signals; and
generate second diagnostic information based on the determined reaction of each processing circuit, wherein the reaction of each processing circuit is associated with testing of a corresponding processing circuit of the plurality of processing circuits.

9. The SoC of claim 1, wherein the controller is further configured to generate first and second notifications that indicate initiation and completion of the testing of the plurality of critical components, respectively, and provide the first and second notifications to an external processor.

10. The SoC of claim 1, wherein the IP core is further configured to detect a first fault event of the set of fault events, and wherein the IP core generates a first response of the set of responses based on the detected first fault event.

11. The SoC of claim 10, wherein the IP core is at least one of a clock monitoring circuit and a reset circuit, the logic circuit is at least one of a clock tree and a reset tree, and the first fault event corresponds to at least one of an absence of a clock signal and a system clock failure.

12. The SoC of claim 1, wherein the fault injector comprises:
a fault generator that is configured to receive the set of input signals and generate the set of fault inputs; and
a first set of multiplexers coupled with the fault generator, wherein each multiplexer of the first set of multiplexers is configured to receive the first select instruction and a subset of fault inputs of the set of fault inputs, and select and inject a first fault input of the subset of fault inputs in the logic circuit based on the first select instruction.

13. The SoC of claim 1, wherein the masking circuit comprises:
a second set of multiplexers, wherein each multiplexer of the second set of multiplexers is configured to receive the second select instruction and a subset of responses of the set of responses, and select and output a first response of the subset of responses based on the second select instruction.

14. The SoC of claim 1, further comprising:
a logic built-in self-test (LBIST) circuit that is coupled with the fault injector and the masking circuit, wherein the LBIST circuit is configured to generate first and second sets of test signals, provide the first set of test signals to the fault injector, and the second set of test signals to the masking circuit, and receive first and second sets of detection signals in response to the first and second sets of test signals, and wherein the first set of test signals is indicative of testing the fault injector, and the second set of test signals is indicative of testing the masking circuit.

15. The SoC of claim 14, wherein the fault injector is further configured to receive the first set of test signals and generate the first set of detection signals, and the masking circuit is further configured to receive the second set of test signals and generate the second set of detection signals.

16. A method for testing a plurality of critical components of a system-on-chip (SoC), the method comprising:
receiving, by a controller of the SoC, a test initiation request;
generating, by the controller, first and second select instructions based on the test initiation request;
receiving, by a fault injector of the SoC, a set of input signals and the first select instruction;
generating, by the fault injector, a set of fault inputs;
injecting, by the fault injectors, the set of fault inputs in a logic circuit of the plurality of critical components to test the logic circuit and an intellectual property (IP) core of the plurality of critical components;
generating, by the logic circuit, a set of fault events;
generating, by the IP core, a set of responses based on the set of fault events, wherein the set of responses is associated with the testing of the logic circuit and the IP core;
masking, by a masking circuit of the SoC, the set of responses when the second select instruction indicates a first value; and
outputting, by the masking circuit, the set of responses when the second select instruction indicates a second value.

17. The method of claim 16, further comprising:
determining, by the controller, whether an anomaly is present or absent in at least one of the logic circuit and the IP core based on the set of responses;
generating, by the controller, a set of control signals based on the determination of the presence or absence of the anomaly, wherein when the anomaly is present, a first control signal of the set of control signals is a power-on reset signal, and indicates to reset the SoC;
generating, by the controller, diagnostic information based on the set of responses and the determination of the presence or absence of the anomaly; and
storing, by the controller, the diagnostic information therein.

18. The method of claim 16, wherein the test initiation request includes test mode data indicating at least one of the first value and the second value, and test information associated with the plurality of critical components, and wherein the second select instruction includes the test mode data.

19. The method of claim 18, wherein the first value of the test mode data corresponds to a non-invasive test mode and the second value of the test mode data corresponds to an invasive test mode.

20. The method of claim 19, wherein in the non-invasive test mode, the set of responses is masked by the masking circuit, and in the invasive test mode, the set of responses is outputted by the masking circuit.

* * * * *